(12) United States Patent
Kim et al.

(10) Patent No.: US 12,046,573 B2
(45) Date of Patent: Jul. 23, 2024

(54) SEMICONDUCTOR DIE, A SEMICONDUCTOR DIE STACK, AND A SEMICONDUCTOR MODULE

(71) Applicant: SK hynix Inc., Icheon-si Gyeonggi-do (KR)

(72) Inventors: Jin Woong Kim, Icheon-si Gyeonggi-do (KR); Mi Seon Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 82 days.

(21) Appl. No.: 17/697,708

(22) Filed: Mar. 17, 2022

(65) Prior Publication Data

US 2023/0139612 A1 May 4, 2023

(30) Foreign Application Priority Data

Oct. 29, 2021 (KR) .......................... 10-2021-0146778

(51) Int. Cl.
*H01L 23/00* (2006.01)
*H01L 25/00* (2006.01)
(Continued)

(52) U.S. Cl.
CPC .............. *H01L 24/30* (2013.01); *H01L 24/04* (2013.01); *H01L 24/05* (2013.01); *H01L 24/11* (2013.01);
(Continued)

(58) Field of Classification Search
CPC ....... H01L 2224/10; H01L 2224/13541; H01L 2224/1601–16052;
(Continued)

(56) References Cited

U.S. PATENT DOCUMENTS 9,184,153 B2 * 11/2015 Lu ........................... H01L 24/94
9,530,706 B2 * 12/2016 Kang .................. H01L 25/0657
(Continued)

FOREIGN PATENT DOCUMENTS

KR 1020110047755 A 5/2011
KR 1020140085874 A 7/2014
(Continued)

*Primary Examiner* — Robert G Bachner
*Assistant Examiner* — Eric Manuel Mulero Flores
(74) *Attorney, Agent, or Firm* — WILLIAM PARK & ASSOCIATES LTD.

(57) ABSTRACT

A semiconductor die stack includes a base die and core dies stacked over the base die. Each of the base die and the core dies include a semiconductor substrate, a front side passivation layer formed over a front side of the semiconductor substrate, a back side passivation layer over a back side of the semiconductor substrate, a through-via vertically penetrating the semiconductor substrate and the front side passivation layer, and a bump, a support pattern, and a bonding insulating layer formed over the front side passivation layer. Top surfaces of the bump, the support pattern, and the bonding insulating layer are co-planar. The bump is vertically aligned with the through-via. The support pattern is spaced apart from the through-via and the bump. The support pattern includes a plurality of first bars that extend in parallel with each other in a first direction and a plurality of second bars that extend in parallel with each other in a second direction.

20 Claims, 14 Drawing Sheets

(51) Int. Cl.
*H01L 25/065* (2023.01)
*H01L 25/18* (2023.01)

(52) U.S. Cl.
CPC .............. *H01L 24/13* (2013.01); *H01L 24/14* (2013.01); *H01L 24/16* (2013.01); *H01L 24/17* (2013.01); *H01L 24/27* (2013.01); *H01L 24/29* (2013.01); *H01L 24/32* (2013.01); *H01L 24/73* (2013.01); *H01L 24/81* (2013.01); *H01L 24/83* (2013.01); *H01L 25/0652* (2013.01); *H01L 25/18* (2013.01); *H01L 25/50* (2013.01); *H01L 2224/0401* (2013.01); *H01L 2224/04026* (2013.01); *H01L 2224/05025* (2013.01); *H01L 2224/05073* (2013.01); *H01L 2224/05082* (2013.01); *H01L 2224/05124* (2013.01); *H01L 2224/05186* (2013.01); *H01L 2224/05573* (2013.01); *H01L 2224/05647* (2013.01); *H01L 2224/05655* (2013.01); *H01L 2224/1146* (2013.01); *H01L 2224/13014* (2013.01); *H01L 2224/13025* (2013.01); *H01L 2224/13147* (2013.01); *H01L 2224/14134* (2013.01); *H01L 2224/14181* (2013.01); *H01L 2224/16146* (2013.01); *H01L 2224/16238* (2013.01); *H01L 2224/17181* (2013.01); *H01L 2224/2746* (2013.01); *H01L 2224/29012* (2013.01); *H01L 2224/29035* (2013.01); *H01L 2224/29147* (2013.01); *H01L 2224/29186* (2013.01); *H01L 2224/3003* (2013.01); *H01L 2224/30051* (2013.01); *H01L 2224/3015* (2013.01); *H01L 2224/30181* (2013.01); *H01L 2224/30505* (2013.01); *H01L 2224/30517* (2013.01); *H01L 2224/30519* (2013.01); *H01L 2224/32145* (2013.01); *H01L 2224/73104* (2013.01); *H01L 2224/73153* (2013.01); *H01L 2224/81201* (2013.01); *H01L 2224/83048* (2013.01); *H01L 2224/83201* (2013.01); *H01L 2924/04941* (2013.01); *H01L 2924/05042* (2013.01)

(58) Field of Classification Search
CPC ........................ H01L 2224/161–16147; H01L 2224/17–17519; H01L 2224/73203; H01L 2224/73204; H01L 2224/81; H01L 2224/818–8183; H01L 2224/13001–13028; H01L 2224/02372; H01L 2225/06513–0652; H01L 2225/06541–06548; H01L 2225/06503–06527; H01L 24/10–14; H01L 23/481; H01L 23/52–5386; H01L 23/49827; H01L 25/04; H01L 25/065–0657; H01L 25/50
See application file for complete search history.

(56) References Cited

U.S. PATENT DOCUMENTS

2012/0049351 A1* 3/2012 Lee ..................... H01L 25/0657
257/737
2019/0244878 A1* 8/2019 Kim ..................... H01L 23/488

FOREIGN PATENT DOCUMENTS

KR           101870155 B1    6/2018
KR           102032907 B1    10/2019
KR        1020200047930 A    5/2020

* cited by examiner

SEMICONDUCTOR DIE, A SEMICONDUCTOR DIE STACK, AND A SEMICONDUCTOR MODULE

CROSS-REFERENCE TO RELATED APPLICATIONS

The present application claims priority to Korean Patent Application No. 10-2021-0146778, filed on Oct. 29, 2021, which is herein incorporated by reference in its entirety.

BACKGROUND

1. Field

The present disclosure provides a semiconductor die having support patterns, a semiconductor die stack having the semiconductor die, a semiconductor module having the semiconductor die stack, a method of manufacturing the semiconductor die, and a method of manufacturing a semiconductor module having the semiconductor die stack.

2. Description of the Related Art

A semiconductor die stack and a semiconductor module including stacked semiconductor dies have been proposed.

SUMMARY

In accordance with an aspect of the present disclosure, a semiconductor die stack includes a base die and core dies stacked over the base die. Each of the base die and the core dies include a semiconductor substrate, a first side passivation layer formed over a first side of the semiconductor substrate, a second side passivation layer over a second side of the semiconductor substrate, a through-via vertically penetrating the semiconductor substrate and the first side passivation layer, and a bump, a support pattern, and a bonding insulating layer formed over the first side passivation layer. Top surfaces of the bump, the support pattern, and the bonding insulating layer are co-planar. The bump is vertically aligned with the through-via. The support pattern is spaced apart from the through-via and the bump. The support pattern includes a plurality of first bars that extend in parallel with each other in a first direction and a plurality of second bars that extend in parallel with each other in a second direction.

In accordance with another aspect of the present disclosure, a semiconductor module includes an interposer and a logic device and a semiconductor die stack mounted over the interposer. The semiconductor die stack includes a base die, a lower core die stacked over the base die, an intermediate core die stacked over the lower core die, an upper core die stacked over the intermediate core die, and a top die stacked over the upper core die. The base die and the lower core die are bonded and stacked in a face-to-face method. The intermediate core die, the upper core die, and the top die are stacked in a face-down method.

In accordance with another aspect of the present disclosure, a method of manufacturing a semiconductor die stack includes forming a first side passivation layer over a first side of the semiconductor substrate, forming a through-via that penetrates the semiconductor substrate, forming a bump and a support pattern over the first side passivation layer, forming a bonding insulating layer over the first side passivation layer to surround the bump and the support pattern, forming a second side passivation layer over a second side of the semiconductor substrate to form a base die, a lower core die, an intermediate core die, and an upper core die, stacking the lower core die over the base die in a face-to-face method, and stacking the intermediate core die and the upper core die over the lower core die in a face-down method.

DETAILED DESCRIPTION

Figure 1:
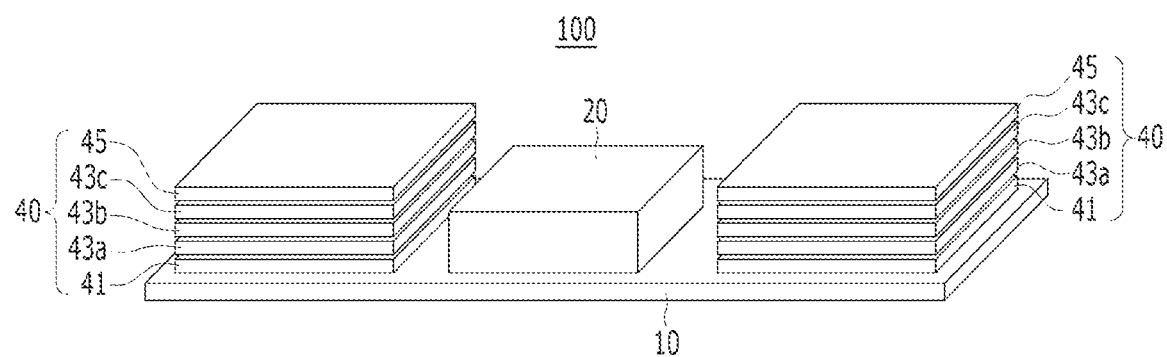
FIG. 1 is a perspective view schematically illustrating a semiconductor module according to an embodiment of the present disclosure.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on"

a substrate, it not only refers to a case where the first layer is formed directly on the second layer.

FIG. 1 is a perspective view schematically illustrating a semiconductor module 100 according to an embodiment of the present disclosure. Referring to FIG. 1, a semiconductor module 100 may include a logic device 20 and a semiconductor die stack 40 that are disposed on an interposer 10. In an embodiment, the semiconductor module 100 may include a logic device 20 that is disposed on a central area of the interposer 10 and semiconductor die stacks 40 that are disposed on sides of the logic device 20. The interposer 10 may include silicon, ceramics, a prepreg, or a PCB (printed circuit board). The interposer 10 may include metal interconnections for electrically connecting the logic device 20 and the semiconductor die stack 40. The logic device 20 may include a microprocessor. The semiconductor die stack 40 may include a plurality of semiconductor dies 41, 43a-43c, and 45, which are vertically stacked. The logic device 20 and the semiconductor die stack 40 may be electrically connected to each other through electrical interconnections in the interposer 10. The plurality of semiconductor dies 41, 43a-43c, and 45 may include a memory semiconductor device, respectively. Accordingly, since the semiconductor module 100 includes a plurality of stacked memory semiconductor dies 41, 43a-43c, and 45, the semiconductor module 100 can provide a high-capacity memory. Since the semiconductor module 100 includes the semiconductor dies 41, 43a-43c, and 45 positioned near the logic device 20, communication between the logic device 20 and the semiconductor dies 41, 43a-43c, and 45 in the semiconductor module 100 can operate in high speed. That is, the semiconductor module 100 may provide a high bandwidth memory (HBM) module.

Figure 2A:
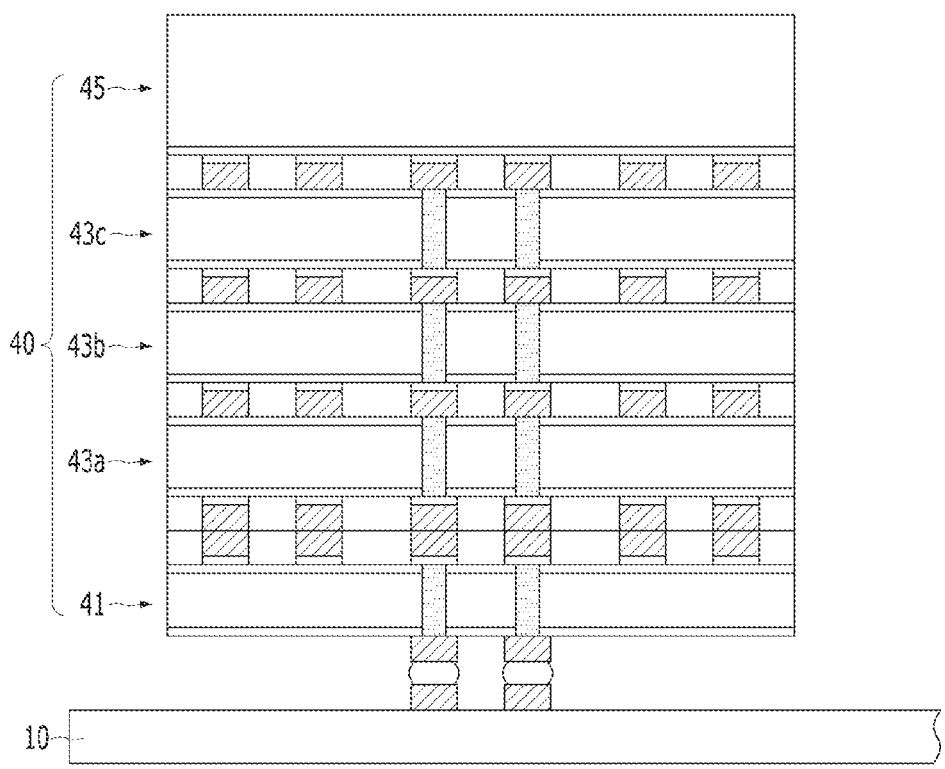
FIG. 2A is a longitudinal cross-sectional view schematically illustrating the semiconductor die stack according to an embodiment of the present disclosure.
Figure 2B:
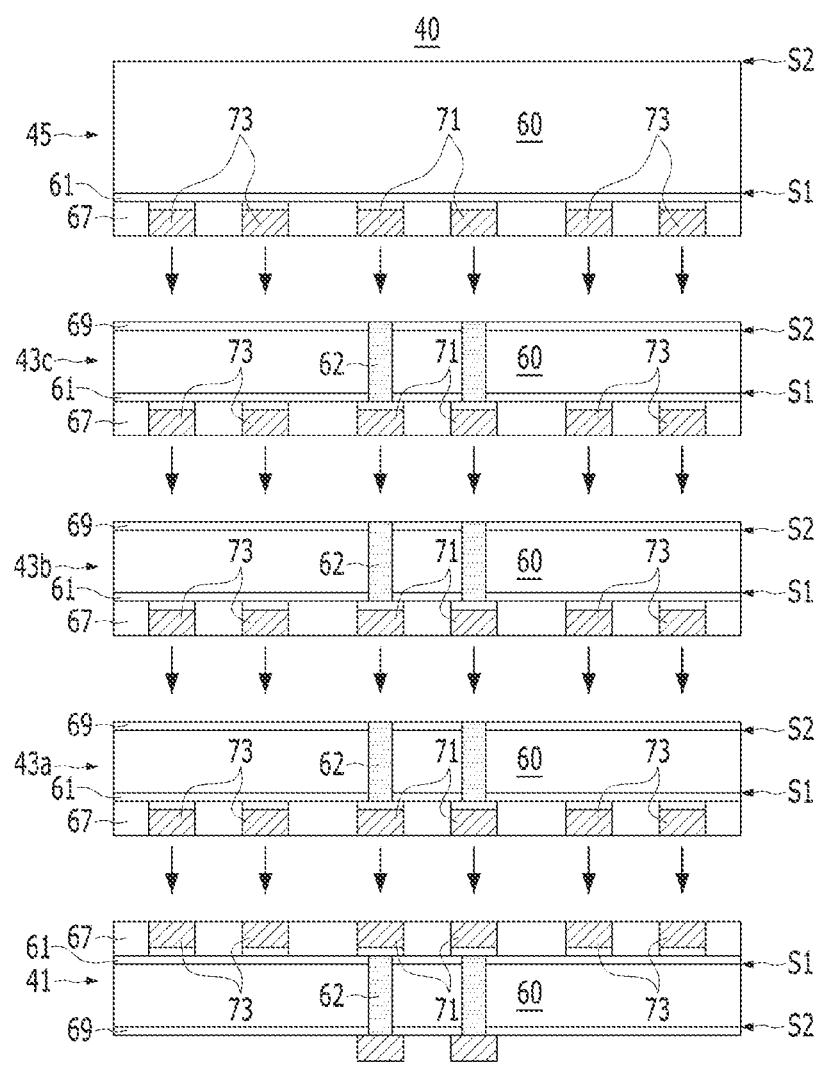
FIG. 2B is a longitudinal cross-sectional view schematically illustrating the semiconductor dies being stacked.

FIG. 2A is a longitudinal cross-sectional view schematically illustrating the semiconductor die stack 40 according to an embodiment of the present disclosure, and FIG. 2B is a longitudinal cross-sectional view schematically illustrating the semiconductor dies 41, 43a-43c, and 45 being stacked. Referring to FIGS. 2A and 2B, a semiconductor die stack 40 may include a base die 41 that is mounted on an interposer 10, and a plurality of core dies 43a-43c that are stacked on the base die 41, and a top die 45 that is stacked on the core dies 43a-43c.

The base die 41 and a lower core die 43a may be stacked in a face-to-face method. For example, a front side S1 of the base die 41 and a front side S1 of the lower core die 43 may be bonded and stacked to face each other. Bumps 71 of the base die 41 and bumps 71 of the lower core die 43 may be directly bonded. Support patterns 73 of the base die 41 and support patterns 73 of the lower core die 43a may be directly bonded. A bonding insulating layer 67 of the base die 41 and a bonding insulating layer 67 of the lower core die 43a may be directly bonded.

The core dies 43a-43c may be stacked in a face-down method. That is, the core dies 43a-43c may be bonded and stacked so that the front sides S1 face downward and the back sides S2 face upward. For example, an intermediate core die 43b may be bonded and stacked on the lower core die 43a so that the back side S2 of the lower core die 43a and the front side S1 of the intermediate core die 43b may face each other. The upper core die 43c may be bonded and stacked on the intermediate core die 43b so that the back side S2 of the intermediate core die 43b and the front side S1 of the upper core die 43c may face each other. Accordingly, upper ends of the through-vias 62 of the lower core die 43a and the bumps 71 of the intermediate core die 43b may be directly bonded with each other, upper ends of the through-vias 62 of the intermediate core die 43b and the bumps 71 of the upper core die 43c may be directly bonded with each other, and upper ends of the through-vias 62 of the upper core die 43c and the bumps 71 of the top die 45 may be directly bonded with each other. In addition, a back side passivation layer 69 of the lower core die 43a may be in direct contact with the bonding insulating layer 67 and the support patterns 73 of the intermediate core die 43b, a back side passivation layer 69 of the intermediate core die 43b may be in direct contact with the bonding insulating layer 67 and the support patterns 73 of the upper core die 43c, and a back side passivation layer 69 of the upper core die 43c may be in direct contact with the bonding insulating layer 67 and the support patterns 73 of the top die 45.

For the sake of lower power consumption with high-speed operation, the vertical thickness of the semiconductor die stack 40 has been gradually decreasing. To achieve this, the present disclosure decreases the vertical thickness of the semiconductor dies 41, 43a-43c, and 45. In addition, the present disclosure reduces the bonding distance between the semiconductor dies 41, 43a-43c, and 45.

If the thickness of the semiconductor dies 41, 43a-43c, and 45 is reduced, during a bonding process and a stacking process, the semiconductor dies 41, 43a-43c, and 45 cannot withstand heat and pressure for bonding and the semiconductor dies 41, 43a-43c, and 45 may be bent or broken. In addition, if the solder bumps are omitted to reduce the bonding gap between the semiconductor dies 41, 43a-43c, and 45, an underfill or epoxy mold compound (EMC) cannot be sufficiently filled between the semiconductor dies 41, 43a-43c, and 45, so that physical and mechanical strength of the semiconductor die stack 40 may be weakened.

According to the present disclosure, in order to reduce the height of the semiconductor die stack 40, the vertical thickness of the semiconductor dies 41, 43a-43c, and 45 can be reduced, and the spacing between the semiconductor dies 41, 43a-43c, and 45 can be minimized.

Specifically, the bumps 71 of the base die 41 and the bumps 71 of the lower core die 43a may be directly bonded without solder bumps. The through-vias 62 and the bumps 71 of the core dies 43a-43c and the top die 45 can be directly bonded without solder bumps and additional bumps.

The bonding insulating layer 67 and the back side passivation layer 69 may include the same material. Accordingly, chemically and physically strong bonding of the bonding insulating layer 67 and the back side passivation layer 69 can be achieved. A strong and stable bonding between the semiconductor dies 41, 43a-43c, and 45 can be provided.

According to the present disclosure, since the bonding insulating layers 67 of the base die 41 and the lower core die 43a are directly contacted and bonded, an underfill or EMC might not be required, no void may be present, and a physically strong bond may be obtained. Since the back side passivation layers 69 and the bonding insulating layers 67 of the core dies 43a-43c and the bonding insulating layer 67 of the top die 45 are directly contacted and bonded, the underfill or EMC might not be required, no void may be present and a physically strong bond may be obtained.

According to the present disclosure, the support patterns 73 that are formed on the front side S1 of the semiconductor substrate 60 can spread and dissipate the heat of the semiconductor dies 41, 43a-43c, and 45, and can physically support the semiconductor dies 41, 43a-43c, and 45. For example, with the heat that is generated during the bonding process, the support patterns 73 can decrease the amount of heat that is transferred to the electrical circuits in the semiconductor substrate 60. Furthermore, the support patterns 73 can physically support the semiconductor dies 41, 43a-43c, and 45 from the pressure that is applied during the bonding process.

Figure 3A:
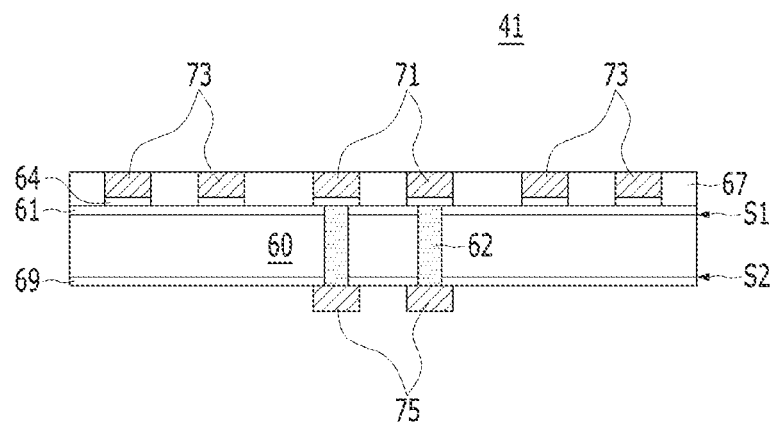
FIG. 3A is a longitudinal cross-sectional view schematically illustrating the base die according to an embodiment of the present disclosure.

FIG. 3A is a longitudinal cross-sectional view schematically illustrating the base die 41 according to an embodiment of the present disclosure. Referring to FIG. 3A, the base die 41 may include the semiconductor substrate 60, the front side passivation layer 61, the bumps 71 and the support patterns 73 on the seed layer 64, the bonding insulating layer 67, the through-vias 62, the back side passivation layer 69, and the pad patterns 75.

The semiconductor substrate 60 of the base die 41 may include a silicon wafer and an interface circuit, a control circuit, and a test circuit that are formed on the silicon wafer. Each circuit may include transistors, conductive interconnections, conductive vias, capacitors, and multiple insulating layers.

The front side passivation layer 61 may be entirely formed on the front side S1 of the semiconductor substrate 60. The front side passivation layer 61 may physically and electrically protect electrical circuits in the semiconductor substrate 60. The front side passivation layer 61 may insulate the electrical elements and the support patterns 73 in the semiconductor substrate 60. The front side passivation layer 61 may include at least one of silicon nitride, polyimide, or other inorganic insulating materials.

Each the through-vias 62 may vertically penetrate the central portion of the semiconductor substrate 60 and the front side passivation layer 61. The through-vias 62 may include metal pillars, such as copper (Cu). The through-vias 62 may be electrically connected to electrical circuits in the semiconductor substrate 60.

The bumps 71 including the seed layers 64 may be formed on the front side passivation layer 61 to be vertically aligned with the through-vias 62. The seed layers 64 may include a barrier metal layer, such as titanium nitride (TiN), and a seed metal layer, such as copper (Cu) or nickel (Ni). The bumps 71 may include a metal, such as copper (Cu). The bumps 71 may be electrically connected to the through-vias 62. In an embodiment, input/output pads (not shown) may be disposed between the through-vias 62 and the seed layers 64 of the bumps 71. The input/output pads may include a metal, such as aluminum (Al).

The support patterns 73 may be formed on the front side passivation layer 61. The support patterns 73 may be electrically insulated from the through-vias 62 and any conductive elements in the semiconductor substrate 60. That is, the support patterns 73 might not transmit electrical signals. The support patterns 73 may have the same vertical thickness as the bumps 71. For example, top surfaces of the support patterns 73 and top surfaces of the bumps 71 may be co-planar.

The bonding insulating layer 67 may be formed on the front side passivation layer 61 to surround the bumps 71 and the support patterns 73. The bonding insulating layer 67 may prevent atomic diffusion from the bumps 71 and the support patterns 73 during a bonding process. The bonding insulating layer 67 may include silicon nitride (SiN). A top surface of the bonding insulating layer 67 may be co-planar with the top surfaces of the bumps 71 and the support patterns 73. In an embodiment, the top surface of the bonding insulating layer 67 may be recessed to be lower than the top surfaces of the bumps 71 and the support patterns 73.

The back side passivation layer 69 may be conformally formed on the back side S2 of the semiconductor substrate 60. The back side passivation layer 69 may include the same material as the bonding insulating layer 67.

The pad patterns 75 may be formed on the back side S2 of the semiconductor substrate 60 to be vertically aligned with the through-vias 62. The pad patterns 75 may include a metal, such as copper (Cu).

Figure 3B:
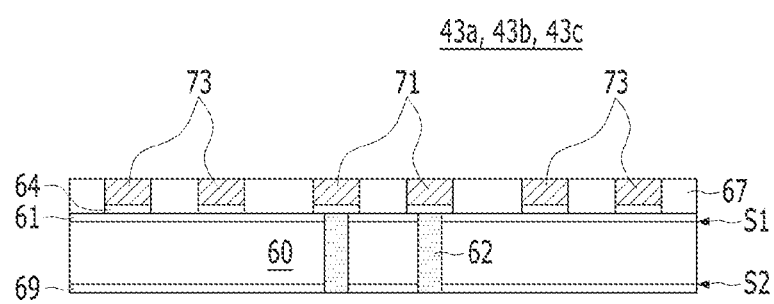
FIG. 3B is a longitudinal cross-sectional view schematically illustrating the core dies according to an embodiment of the present disclosure.

FIG. 3B is a longitudinal cross-sectional view schematically illustrating the core dies 43a-43c according to an embodiment of the present disclosure. Referring to FIG. 3B, each of the core dies 43a-43c may include the semiconductor substrate 60, the front side passivation layer 61, the bumps 71 and the support patterns 73 having the seed layers 64, the bonding insulating layer 67, the through-vias 62, and the back side passivation layer 69. The front side passivation layer 61, the seed layers 64, the bumps 71, the support patterns 73, and the bonding insulating layer 67 may be formed on the top surface of the semiconductor substrate 60. The through-vias 62 may vertically penetrate the semiconductor substrate 60. The back side passivation layer 69 may be formed on the bottom surface of the semiconductor substrate 60. For example, the core dies 43a-43c may include a memory device, such as a DRAM. The semiconductor substrate 60 of the core dies 43a-43c may include a silicon wafer and memory circuits that are formed on the silicon wafer. The memory circuits may include transistors, conductive interconnections, conductive vias, capacitors, and a plurality of insulating layers. Compared to the base die 41 of FIG. 3A, the pad patterns 75 on the back side S2 of the semiconductor substrate 60 may be omitted.

Figure 3C:
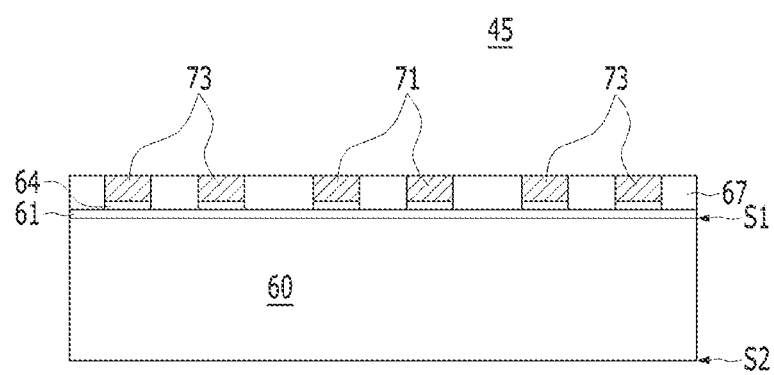
FIG. 3C is a longitudinal cross-sectional view schematically illustrating the top die according to an embodiment of the present disclosure.

FIG. 3C is a longitudinal cross-sectional view schematically illustrating the top die 45 according to an embodiment of the present disclosure. Referring to FIG. 3C, the top die 45 may include the semiconductor substrate 60, the front side passivation layer 61, the bumps 71 and support patterns 73 having the seed layers 64, and the bonding insulating layer 67. Compared to the base die 41 and the core die 43a-43c, shown in FIGS. 3A and 3B, the through-vias 62 may be omitted. Also, the back side passivation layer 69 may be omitted. The semiconductor substrate 60 of the top die 45 may be thicker than the semiconductor substrate 60 of the core dies 43a-43c. The top die 45 may include a memory device that is functionally same as the core die 43a-43c. For example, the semiconductor substrate 60 of the top die 45 may include a silicon wafer and memory circuits formed on the silicon wafer. In an embodiment, the top die 45 may further include through-vias 62. In an embodiment, the top die 45 may further include the back side passivation layer 69 of FIG. 2B.

FIGS. 4A to 4F are top views of semiconductor dies 41, 43a-43c, and 45 in accordance with various embodiments of the present disclosure. Referring to FIGS. 4A to 4F, each of the semiconductor dies 41, 43a-43c, and 45 may include the bumps 71, the support patterns 73, and the bonding insulating layer 67 that are disposed on the top surfaces thereof. The bumps 71 may be arranged to form at least one row in the central area of each of the semiconductor dies 41, 43a-43c, and 45. For example, in the drawings, the bumps 71 are arranged in two rows. The plurality of bumps 71 may be spaced apart from each other. The support patterns 73 may include edge support patterns 73a and center support patterns 73b. The edge support patterns 73a may be disposed to be adjacent to edges of the semiconductor dies 41, 43a-43c, and 45, respectively. The center support patterns 73b may be disposed in central areas of the semiconductor dies 41, 43a-43c, and 45, respectively. As mentioned above, each of the center support patterns 73b may be spaced apart from the bumps 71.

Figure 4A:
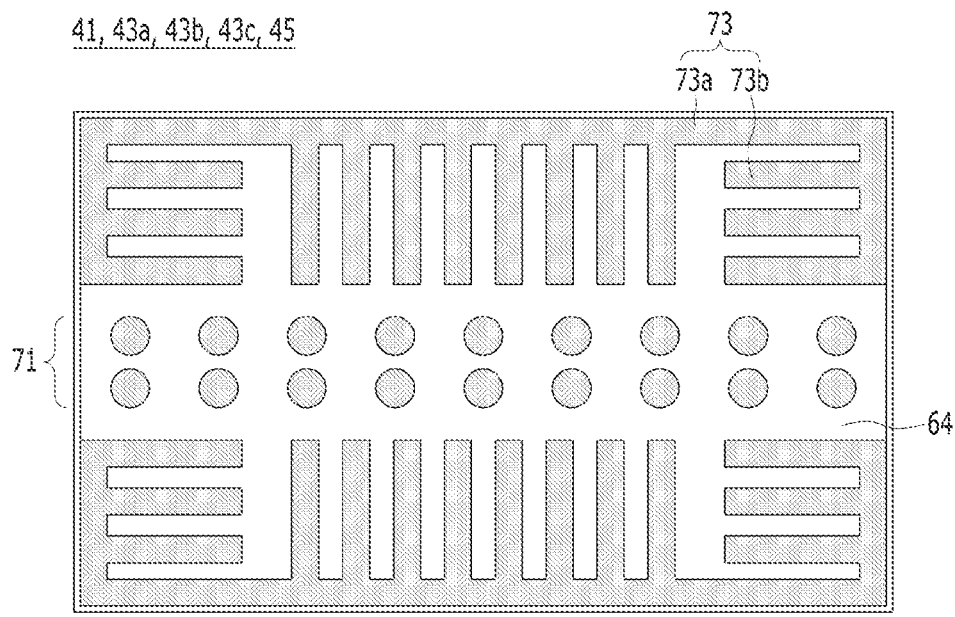
FIGS. 4A to 4F are top views of semiconductor dies in accordance with various embodiments of the present disclosure.

Referring to FIG. 4A, each of the edge support patterns 73a may have a line shape or a frame shape that extends along the edge of each of the semiconductor dies 41, 43a-43c, and 45. In an embodiment, each of the edge support patterns 73a may have a half-frame shape. In an embodiment, each of the edge support patterns 73a may have a quarter-frame shape. Each of the center support patterns 73b may have a bar shape that extends from each of the edge support patterns 73a to the central area of each of the semiconductor dies 41, 43a-43c, and 45. For example, each of the center support patterns 73b may include a first bar that extends in a first direction or a second bar that extends in a second direction. More specifically, the first bar may be a row bar that extends in a row direction, and the second bar may be a column bar that extends in a column direction. Each of the edge support patterns 73a and each of the center support patterns 73b may be connected to each other.

Figure 4B:
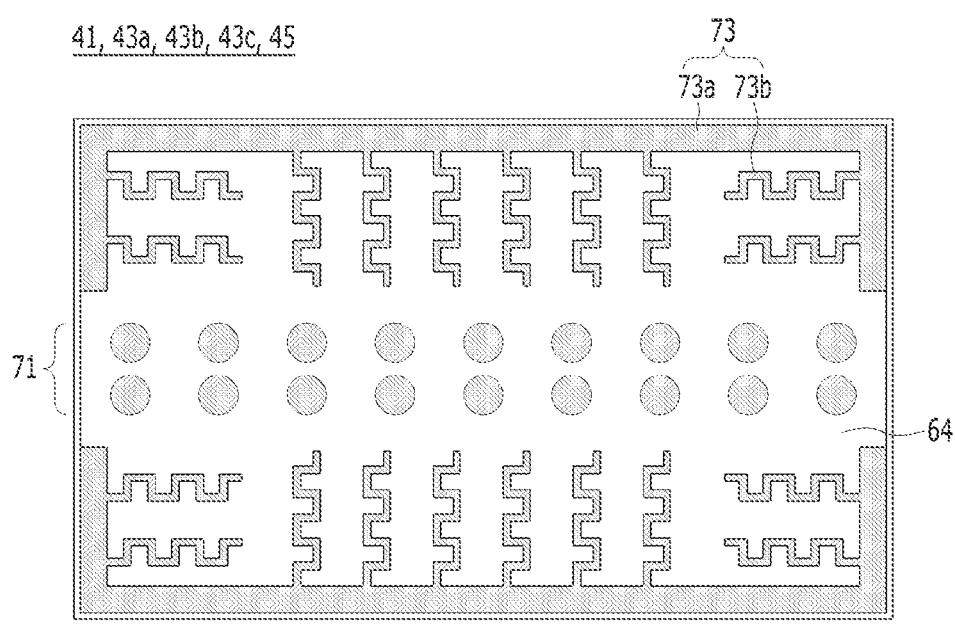

Referring to FIG. 4B, each of the center support patterns 73b may have a serpentine shape that extends from each of the edge support patterns 73a to the central area of each of the semiconductor dies 41, 43a-43c, and 45. For example, each of the center support patterns 73b may have first segments that extend in the first direction and second segments that extend in the second direction. More specifically, the first segments may be row segments that extend in the row direction, and the second segments may be column segments that extend in the column direction.

Figure 4C:
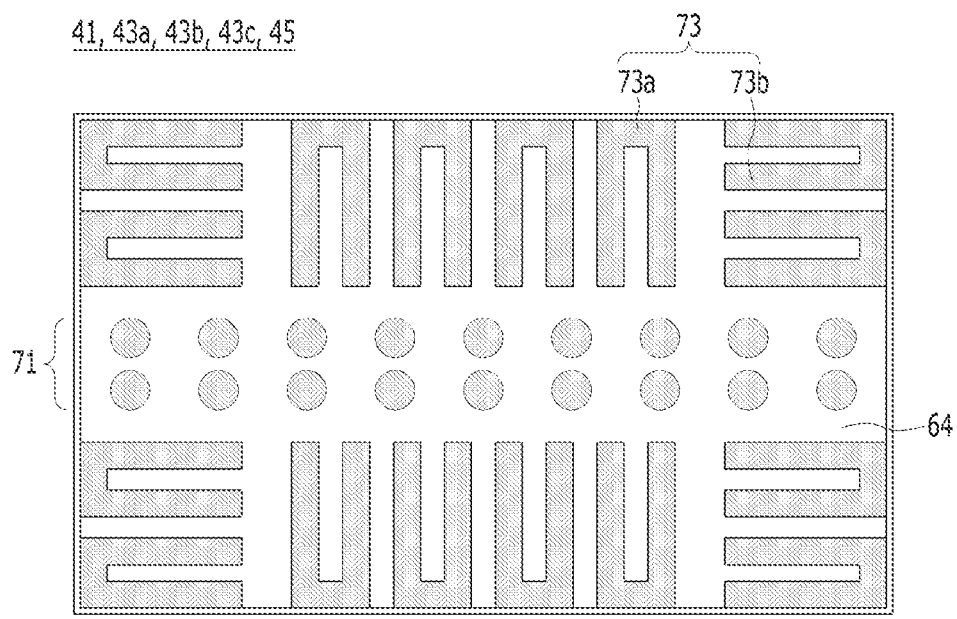
Figure 4D:
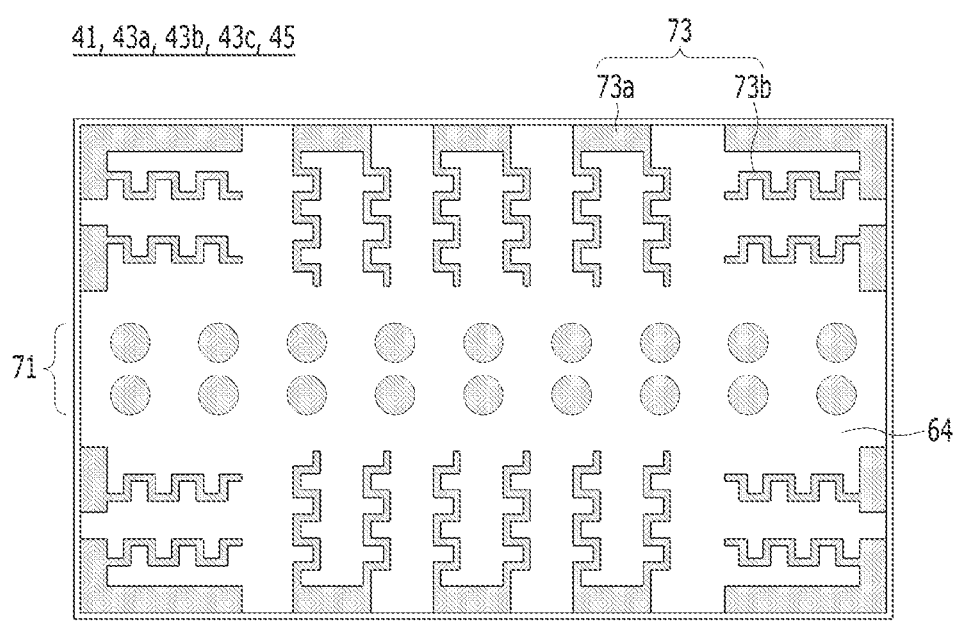

Referring to FIGS. 4C and 4D, each of the edge support patterns 73a may be separated into a plurality of edge support patterns 73a. For example, each of the separated edge support patterns 73a may have a bar shape or a segment shape.

Figure 4E:
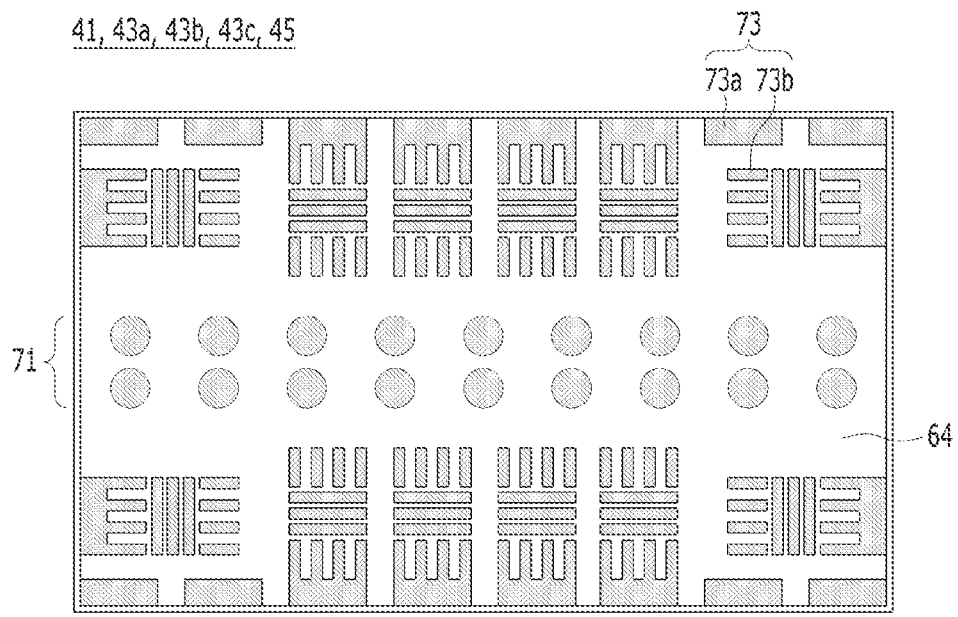

Referring to FIG. 4E, each of the edge support patterns 73a may have a bar shape or a segment shape, and each of the center support patterns 73b may have a first bar shape and a second bar shape (i.e., a row bar shape and a column bar shape). Some of the center support patterns 73b may be connected to the edge support patterns 73a, and some of the center support patterns 73b might not be connected to the edge support patterns 73a. In an embodiment, with further reference to FIGS. 4A to 4C, each of the edge support patterns 73a may have a half-frame shape or a quarter-frame shape. The center support patterns 73b may include a plurality of row bars and a plurality of column bars that are alternately arranged.

Figure 4F:
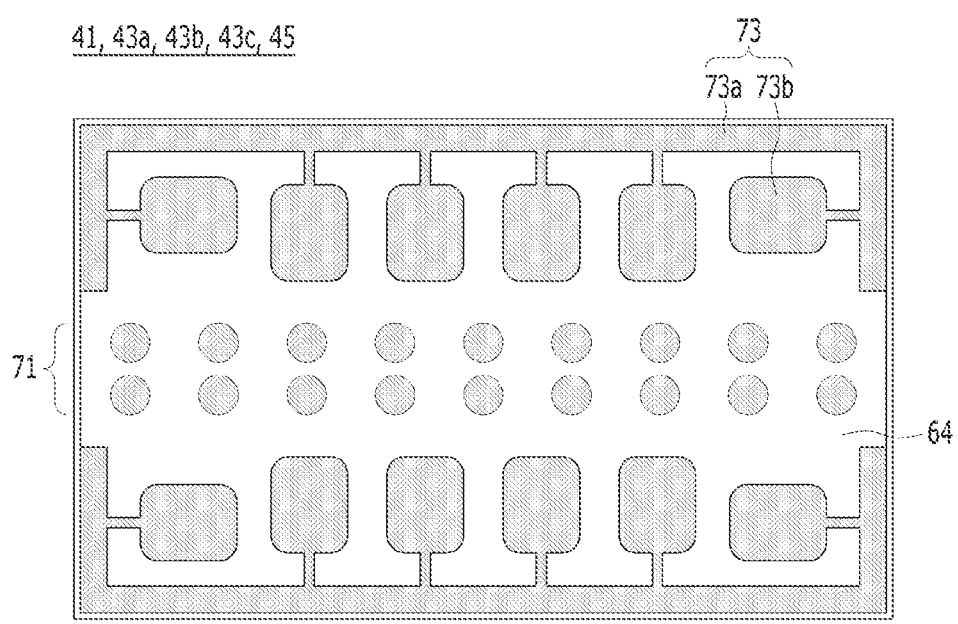

Referring to FIG. 4F, each of the center support patterns 73b may have a square shape. Each of the center support patterns 73b may be connected to the edge support patterns 73a.

In an embodiment, the edge support patterns 73a may be omitted in FIGS. 4A to 4F.

Referring to 4A to 4F, the support patterns 73 may include the plurality of edge support patterns 73a and the plurality of center support patterns 73b that extend in the row direction and the column direction. Accordingly, the physical pressure in the row direction and the column direction of the semiconductor dies 41, 43a-43c, and 45 can be relieved, and warping or cracking of the semiconductor dies 41, 43a-43c, and 45 can be prevented.

The support patterns 73 may include a plurality of separated edge support patterns 73a and a plurality of separated center support patterns 73b. Alternatively, the support patterns 73 may have a serpentine shape. For example, one end of the row bars (or row segments) of the support patterns 73 may be connected to one end of the column bars (or column segments) of the support pattern 73 so that each of the support patterns 73 may have a serpentine shape. Accordingly, the edge support patterns 73a and the center support patterns 73b may have flexibility to withstand thermal and physical pressure in the row direction and the column direction and may have resistance to cracks.

The total surface area and total volume of the support patterns 73 may be sufficiently greater than the total surface area and total volume of the bumps 71. Accordingly, heat that is generated from the semiconductor dies 41, 43a-43c, and 45 may be effectively spread and dissipated through the support patterns 73.

Figure 5A:
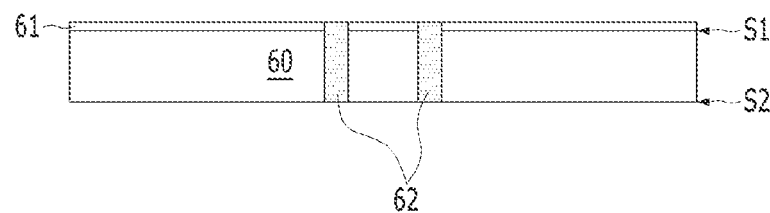
FIGS. 5A to 5G illustrate methods of forming a semiconductor die according to an embodiment of the present disclosure.

FIGS. 5A to 5E illustrate a method of forming a semiconductor die according to an embodiment of the present disclosure. Referring to FIG. 5A, a method of forming a semiconductor die may include preparing a semiconductor substrate 60 having electrical circuits and insulating layers that are formed on a silicon wafer, forming through-vias 62 that vertically penetrate the semiconductor substrate 60, and forming a front side passivation layer 61 on a front side S1 of the semiconductor substrate 60. Forming the front side passivation layer 61 may include performing a deposition process or a coating process to form at least one of silicon nitride (SiN) layer, a polyimide layer, or another inorganic insulating layer on the front side S1 of the semiconductor substrate 60. Forming the through-vias 62 may include forming a deep hole in the semiconductor substrate 60, filling a conductive material in the hole, and thinning the semiconductor substrate 60. Accordingly, the through-vias 62 may penetrate the semiconductor substrate 60. Forming the through-vias 62 may include performing a plating process to form copper (Cu) pillars. Input/output pads (not shown) may be further formed on upper ends of the through-vias 62. The input/output pads may be exposed on the front side passivation layer 61. Lower ends of the through-vias 62 may also be exposed on the back side S2 of the substrate 60.

Figure 5B:
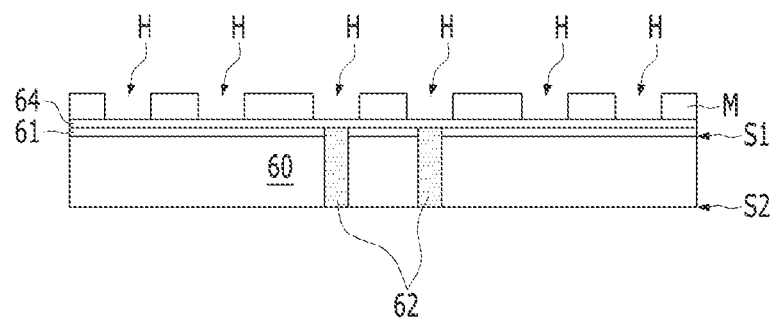

Referring to FIG. 5B, the method may further include forming a seed layer 64 on the front side passivation layer 61 and forming a plating mask pattern M on the seed layer 64. The seed layer 64 may be electrically connected to the upper ends of the through-vias 62. The seed layer 64 may include a barrier metal layer and a plating metal layer. For example, the barrier metal layer may include a titanium (Ti) layer or titanium nitride (TIN) layer, and the plating metal layer may include a copper (Cu) layer. In an embodiment, the plating metal layer may include a nickel (Ni) layer or a titanium (Ti) layer. The plating mask pattern M may include a photoresist. The plating mask pattern M may include a plurality of holes H that expose the seed layer 64.

Figure 5C:
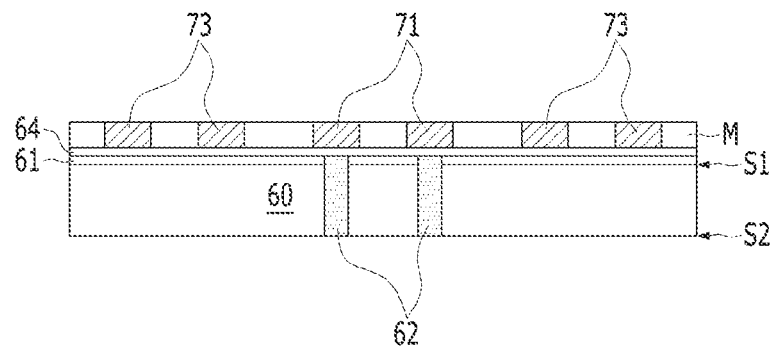

Referring to FIG. 5C, the method may further include performing a plating process to form bumps 71 and support patterns 73 in the holes H. That is, the bumps 71 and the support patterns 73 may be formed at the same time and may include the same material. For example, the bumps 71 and the support patterns 73 may include copper (Cu). Top surfaces of the bumps 71 and the support patterns 73 may be co-planar.

Figure 5D:
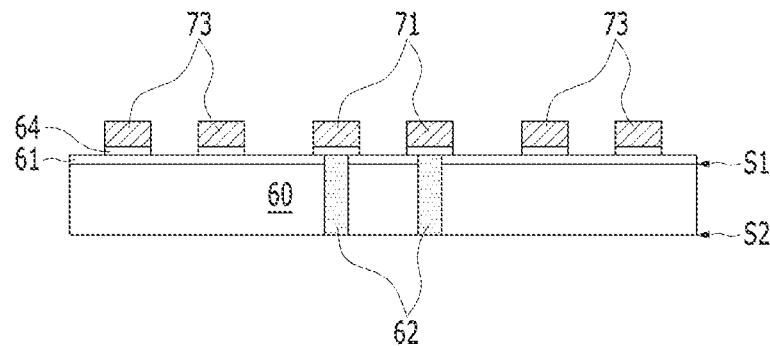

Referring to FIG. 5D, the method may further include performing a strip process or an ashing process to remove the plating mask pattern M and performing an etching process to remove the seed layer 64 that is buried under the plating mask pattern M. The seed layer 64 may remain only under the bumps 71 and the support patterns 73. The front side passivation layer 61 may be exposed between the bumps 71 and the support patterns 73.

Figure 5E:
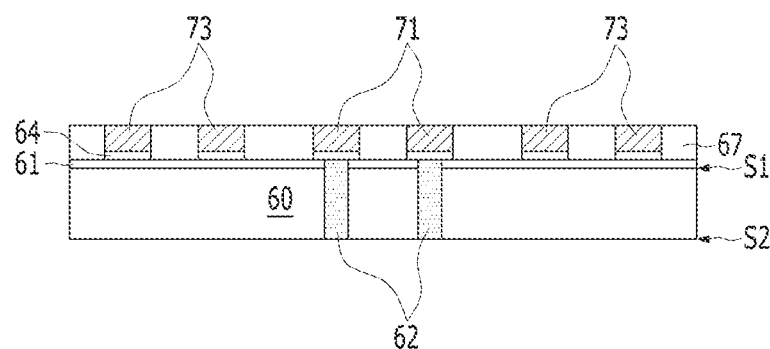

Referring to FIG. 5E, the method may further include performing a deposition process and a planarization process to form a bonding insulating layer 67 between the bumps 71. The bonding insulating layer 67 may be formed by performing a deposition process, such as a chemical vapor deposition (CVD) process or a physical vapor deposition (PVD) process, to form an insulating material that covers the bumps 71 and the support patterns 73 on the front side passivation layer 61, and by performing a planarization process, such as chemical mechanical polishing (CMP) or an etching process. The bonding insulating layer 67 may include silicon nitride (SiN). Since the bumps 71 and the support patterns 73 include copper, the bonding insulating layer 67 might not include silicon oxide ($SiO_2$).

Figure 5F:
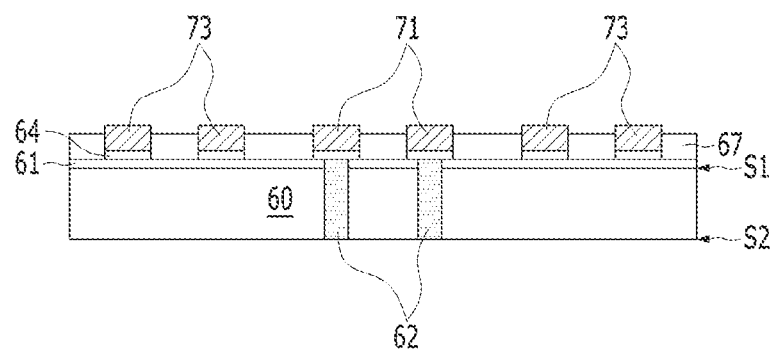

In an embodiment, referring to FIG. 5F, the method may further include performing a CMP process or an etch-back process to recess a top surface of the bonding insulating layer 67. The top surface of the bonding insulating layer 67 may be lower than the top surfaces of the bumps 71 and the support patterns 73.

Figure 5G:
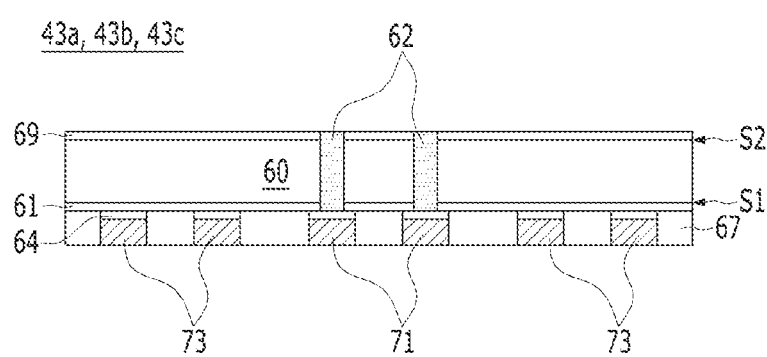

Referring to FIG. 5G, the method may further include forming a back side passivation layer 69 on a back side S2 of the semiconductor substrate 60. The back side passivation layer 69 may include the same material as the bonding insulating layer 67. The back side passivation layer 69 may include silicon nitride (SiN). Forming the back side passivation layer 69 may include partially recessing the lower portion of the semiconductor substrate 60 so that the lower ends of the through-vias 62 protrudes from the semiconductor substrate 60, forming a back side passivation material layer on the lower surface of the semiconductor substrate 60 to surround the lower ends of the through-vias 62, and performing a planarization process, such as CMP or an etching process, to expose the lower ends of the through-vias 62. The core dies 43a-43c may be formed by performing the processes that are described with reference to FIGS. 5A to 5G.

Figure 6:
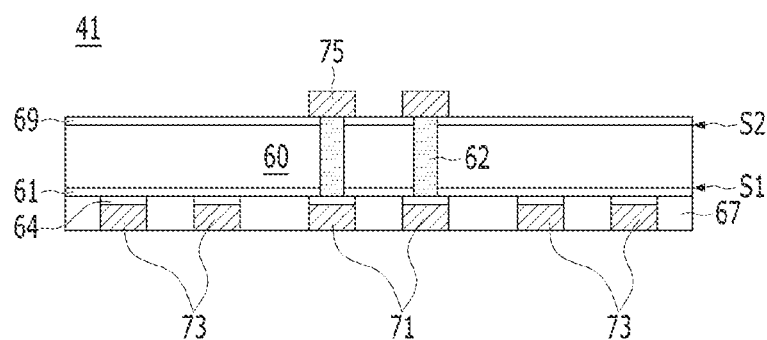
FIG. 6 is a view illustrating a method of forming a base die according to an embodiment of the present disclosure.

FIG. 6 is a view illustrating a method of forming a base die 41 according to an embodiment of the present disclosure. Referring to FIG. 6, a method of forming a base die 41 may include forming pad patterns 75 that are aligned with the through-vias 62 on the back side passivation layer 69 on the bottom surface of the die described with reference to FIGS. 5A-5G. Forming the pad patterns 75 may include performing the processes that are described with reference to FIGS. 3A to 3C. For example, the pad patterns 75 may also include a seed material and copper (Cu). The base die 41 may be formed by performing the processes that are described with reference to FIGS. 5A to 5G and FIG. 6.

Figure 7A:
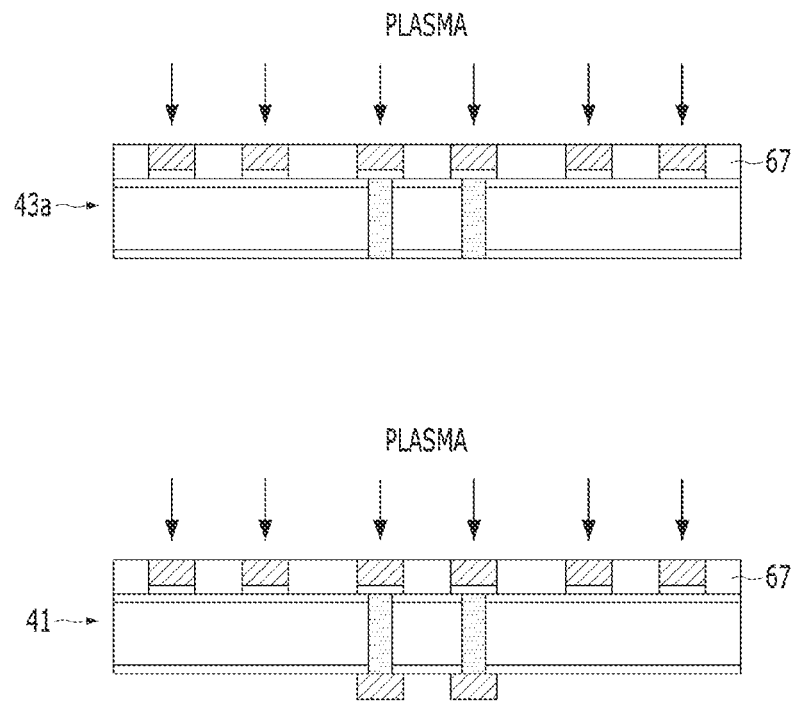
FIGS. 7A to 7F are views illustrating a method of forming a semiconductor die stack according to an embodiment of the present disclosure.
Figure 7B:
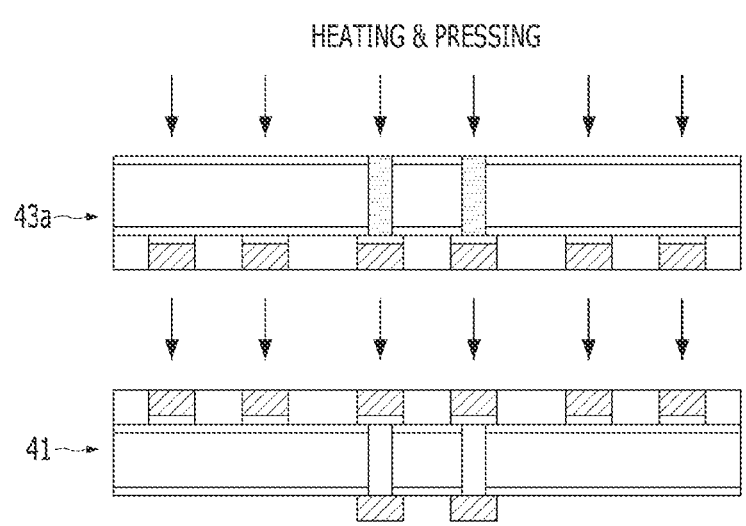

FIGS. 7A to 7E are views illustrating a method of forming a semiconductor die stack 40 according to an embodiment of the present disclosure. Referring to FIG. 7A, a method of forming a semiconductor die stack 40 may include treating surfaces of the bonding insulating layers 67, the bumps 71, and the support patterns 73 of the base die 41 and the lower core die 43a by performing a plasma treatment process. The plasma treatment may include processing the surface of the bonding insulating layer 67 at a temperature of substantially 100° ° C. to 400° C. by using a gas combination including at least one of nitrogen ($N_2$), oxygen ($O_2$), or ($H_2$). Through the plasma treatment, the adhesive force of the bonding insulating layer 67 of the base die 41 and the bonding insulating layer 67 of the lower core die 43a may be strengthened. Referring to FIG. 7B, the method may further include performing a first bonding process to bond and adhere the front side S1 of the lower core die 43a to the front side S1 of the base die 41 in a face-to-face method. The first bonding process may include heating and pressing the lower core die 43a to bond the front side S1 of the lower core die 43a to the front side S1 of the base die 41. The bumps 71 of the base die 41 and the bumps 71 of the lower core die 43a may be directly bonded to each other, and the support patterns 73 of the base die 41 and the support patterns 73 of the lower core die 43a may be directly bonded to each other. In addition, the bonding insulating layer 67 of the base die 41 and the bonding insulating layer 67 of the lower core die 43a may be directly bonded to each other.

Figure 7C:
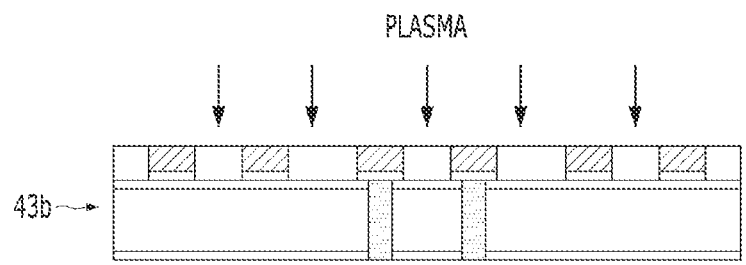
Figure 7C:
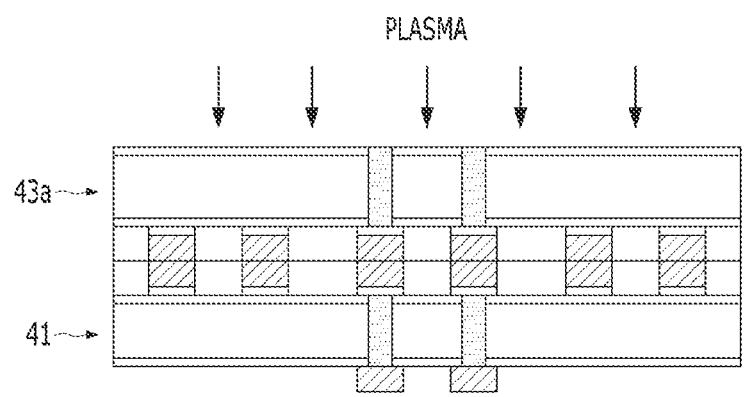

Referring to FIG. 7C, the method may further include treating the back side passivation layer 69 of the lower core die 43a and the front side passivation layer 61 of the intermediate core die 43b by performing the plasma treatment process.

Figure 7D:
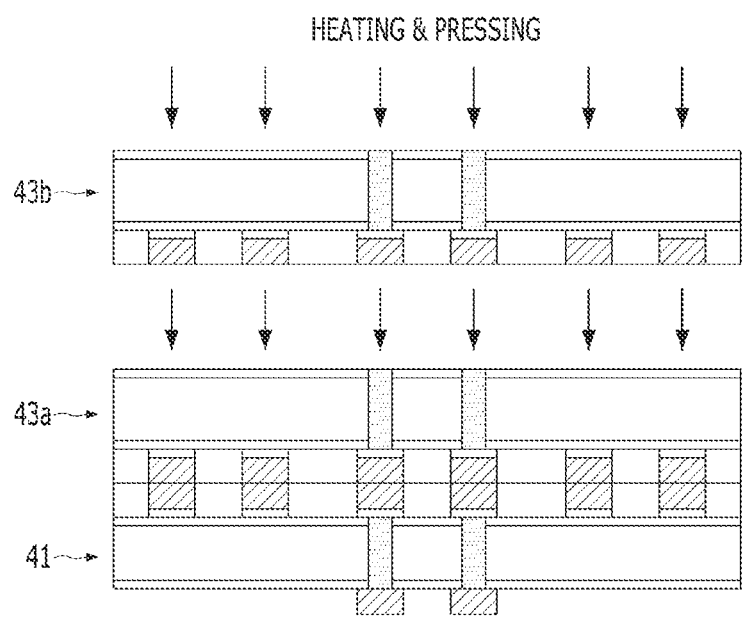

Referring to FIG. 7D, the method may further include performing a second bonding process to bond and stack the front side S1 of the intermediate core die 43b on the back side S2 of the lower core die 43a. The second bonding process may include heating and pressing the intermediate core die 43b to bond the front side S1 of the intermediate core die 43b to the back side S2 of the lower core die 43a.

Figure 7E:
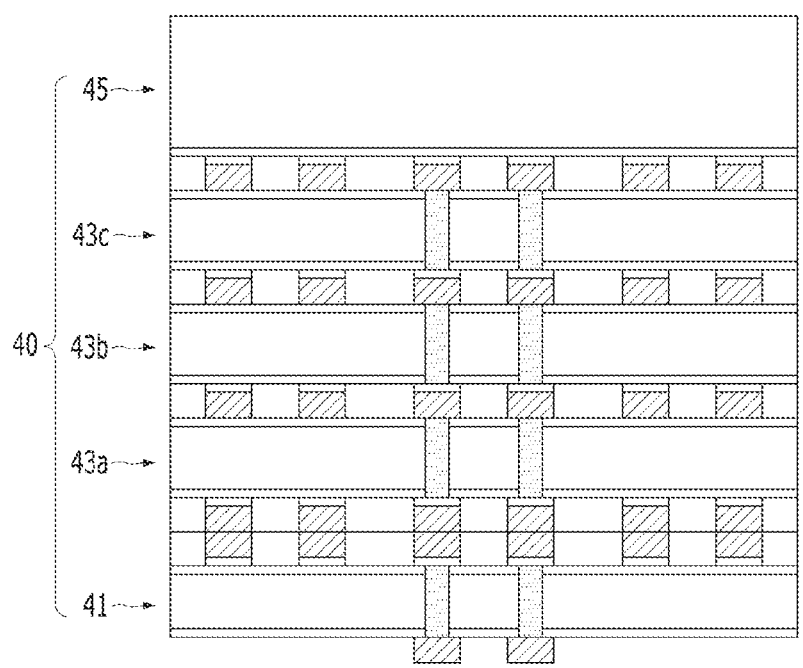

Referring to FIG. 7E, the method may include bonding and stacking the upper core die 43c on the intermediate core die 43b and bonding and stacking the top die 45 on the upper core die 43c by referring to the processes that are described with reference to FIGS. 7A to 7D. The semiconductor die stack 40 may be formed by performing the processes that are described with reference to FIGS. 7A to 7E.

Figure 7F:
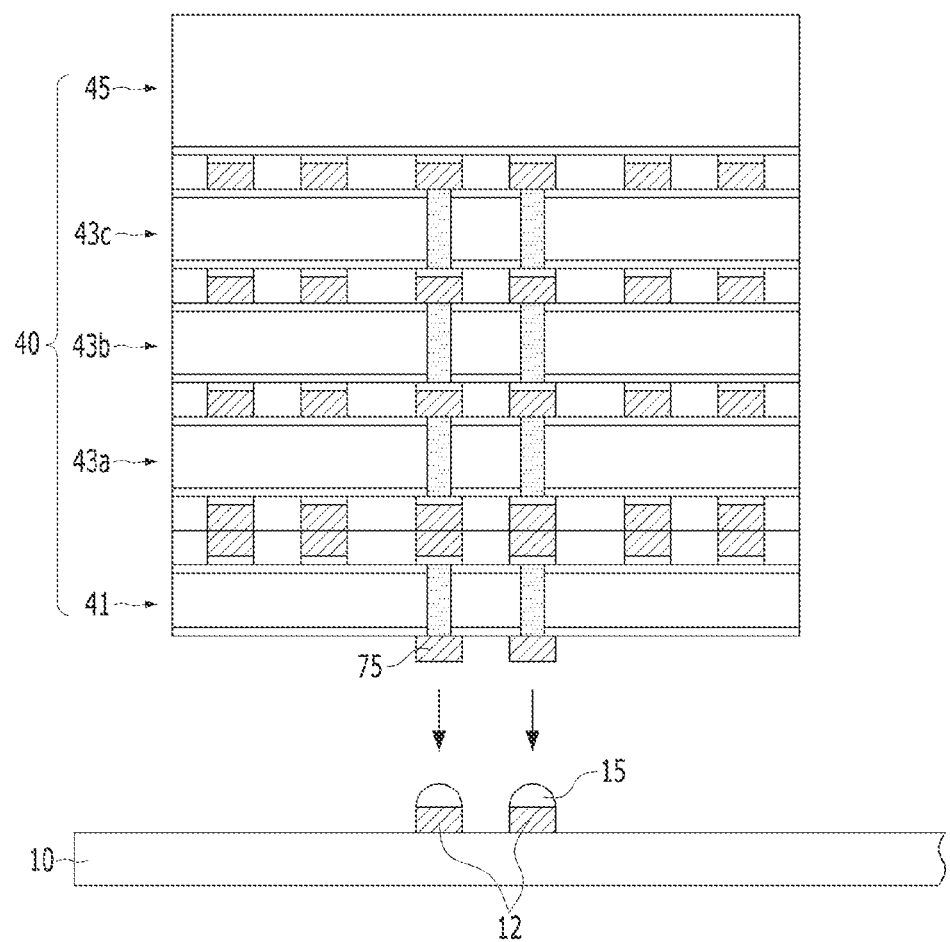

FIG. 7F is a longitudinal cross-sectional view illustrating that the semiconductor die stack 40 according to an embodiment of the present disclosure is mounted on the interposer 10. Referring to FIG. 7F, the semiconductor die stack 40 may be mounted on the interposer 10. Connection pads 12 of the interposer 10 and the pad patterns 75 of the base die 41 of the semiconductor die stack 40 may be electrically connected to each other through solder bumps 15. Underfill or EMC (Epoxy Molding Compound) may be filled between the interposer 10 and the semiconductor die stack 40.

According to the present disclosure, the bonding insulating layer of the base die and the bonding insulating layer of the lower core die are directly contacted and bonded. Accordingly, underfill or EMC are not required, there is no void, and a physically strong bonding can be obtained.

The back side passivation layers and the bonding insulating layers of the core dies and the bonding insulating layer of the top die may be directly contacted and bonded. Accordingly, the underfill or the EMC might not be required, no void may be present, and a physically strong bonding may be obtained.

According to the present disclosure, heat of the semiconductor dies may be spread and dissipated by the support patterns formed on the front side of the semiconductor substrate. The semiconductor dies may be physically supported by the support patterns formed on the front side of the semiconductor substrate.

Accordingly, with the heat that is generated during the bonding process, the support patterns can decrease the amount of heat that is transferred to the electrical circuits in the semiconductor substrate, and the semiconductor dies may be physically supported against the pressure that is applied during the bonding process.

According to the embodiments of the present disclosure, off-current and leakage current of the transistor can be reduced, and data retention of the semiconductor device can be improved.

Although the present disclosure has been specifically described according to the above-described preferred embodiments, it should be noted that the above-described embodiments are for the purpose of explanation and not for the limitation thereof. In addition, it will be appreciated by person having ordinary skill in the art that various embodiments are possible within the scope of the present disclosure.

What is claimed is:

1. A semiconductor die stack comprising:
   a base die; and
   core dies stacked over the base die,
   wherein each of the base die and the core dies include:
      a semiconductor substrate;
      a first side passivation layer formed over a first side of the semiconductor substrate;
      a second side passivation layer over a second side of the semiconductor substrate;
      a through-via vertically penetrating the semiconductor substrate and the first side passivation layer; and
      a bump, a support pattern, and a bonding insulating layer formed over the first side passivation layer,
   wherein top surfaces of the bump, the support pattern, and the bonding insulating layer are co-planar,
   wherein the bump is vertically aligned with the through-via,
   wherein the support pattern is spaced apart from the through-via and the bump, and
   wherein the support pattern includes a plurality of first bars that extend in parallel with each other in a first direction and a plurality of second bars that extend in parallel with each other in a second direction.

2. The semiconductor die stack of claim 1,
   wherein the first direction is perpendicular to the second direction.

3. The semiconductor die stack of claim 1,
   wherein the core dies include:
      a lower core die stacked over the base die;
      an intermediate core die stacked over the lower core die; and
      an upper core die stacked over the intermediate core die,
   wherein the bump of the base die is bonded to the bump of the lower core die,
   wherein the support pattern of the base die is bonded to the support pattern of the lower core die, and
   wherein the bonding insulating layer of the base die is bonded to the bonding insulating layer of the lower core die.

4. The semiconductor die stack of claim 3,
   wherein the through-via of the lower core die is bonded to the bump of the intermediate core die,
   wherein the second side passivation layer of the lower core die is bonded to the support pattern and the bonding insulating layer of the intermediate core die,
   wherein the through-via of the intermediate core die is bonded to the bump of the upper core die, and
   wherein the second side passivation layer of the intermediate core die is in contact with the support pattern and the bonding insulating layer of the upper core die.

5. The semiconductor die stack of claim 3,
   wherein the second side passivation layer and the bonding insulating layer include a silicon nitride layer.

6. The semiconductor die stack of claim 3,
   wherein the plurality of first bars and the plurality of second bars are separated from each other.

7. The semiconductor die stack of claim 3,
   wherein the plurality of first bars and the plurality of second bars are alternately arranged.

8. The semiconductor die stack of claim 3,
   wherein the plurality of first bars and the plurality of second bars are connected to each other in a serpentine shape.

9. The semiconductor die stack of claim 3,
   wherein the support pattern includes an edge support pattern that is adjacent to an edge of each of the semiconductor dies and a center support pattern that is disposed in a central area of each of the semiconductor dies,
   wherein the edge support pattern has a line shape that extends along the edge of the semiconductor die, and
   wherein the center support pattern has a bar shape or a segment shape that extends from the edge support pattern to the central area of each of the semiconductor dies.

10. A semiconductor module comprising:
    an interposer; and
    a logic device and a semiconductor die stack mounted over the interposer,
    wherein the semiconductor die stack includes:
       a base die;
       a lower core die stacked over the base die;
       an intermediate core die stacked over the lower core die;
       an upper core die stacked over the intermediate core die; and
       a top die stacked over the upper core die,
    wherein the base die and the lower core die are bonded and stacked in a face-to-face method, and
    wherein the intermediate core die, the upper core die, and the top die are stacked in a face-down method,
    wherein each of the base die, the lower core die, the intermediate core die, and the upper core die includes:
       a semiconductor substrate including an electric circuit;
       a first side passivation layer over a first side of the semiconductor substrate;
       a second side passivation layer over a second side of the semiconductor substrate;
       a through-via vertically penetrating the first side passivation and the semiconductor substrate;
       a bump and a support pattern over the first side passivation layer; and
       a bonding insulating layer formed over the first side passivation layer to surround the bump and the support pattern,
    wherein the bump is vertically aligned with the through-via and electrically connected to the electric circuit in the semiconductor substrate, and
    wherein the support pattern is spaced apart from the through-via to not be electrically connected to the electric circuit in the semiconductor substrate.

11. The semiconductor module of claim 10,
    wherein the second side passivation layer and the bonding insulating layer include a same material.

12. The semiconductor module of claim 10,
    wherein top surfaces of the bump, the support pattern, and the bonding insulating layer are co-planar.

13. The semiconductor module of claim 10,
    wherein the support pattern includes a plurality of first bars that extend in a first direction and a plurality of second bars that extend in a second direction that is perpendicular to the first direction.

14. The semiconductor module of claim 10,
    wherein the support pattern includes an edge support pattern that is disposed to be adjacent to an edge of each of the semiconductor dies and a center support pattern that is disposed in a central area of each of the semiconductor dies, wherein the edge support pattern has a line shape that extends along the edge of each of the semiconductor dies, and wherein the center support pattern has a bar shape or a segment shape that extends from the edge support pattern to the central area of each of the semiconductor dies.

15. The semiconductor module of claim 14, wherein the center support pattern has a serpentine shape having first segments that extend in a first direction and second segments that extend in a second direction.

16. The semiconductor module of claim 10, wherein the bump of the base die is bonded to the bump of the low core die, wherein the support pattern of the base die is bonded to the support pattern of the lower core die, and wherein the bonding insulating layer of the base die is bonded to the bonding insulating layer of the lower core die.

17. The semiconductor module of claim 10, wherein the through-via of the lower core die is bonded to the bump of the intermediate core die, wherein the second side passivation layer of the lower core die is bonded to the support pattern and the bonding insulating layer of the intermediate core die, wherein the through-via of the intermediate core die is bonded to the bump of the upper core die, and wherein the second side passivation layer of the intermediate core die is bonded to the support pattern and the bonding insulating layer of the upper core die.

18. The semiconductor module of claim 10, wherein the top die includes:

a semiconductor substrate having an electric circuit;

a first side passivation layer over a first side of the semiconductor substrate;

a bump and a support pattern over the first side passivation layer; and a bonding insulating layer formed over the first side passivation layer to surround the bump and the support pattern, wherein the through-via of the upper core die is bonded to the bump of the top die, and wherein the second side passivation layer of the upper core die is in contact with the support pattern and the bonding insulating layer of the top die.

19. The semiconductor module of claim 10, wherein the interposer includes a connection pad over an upper side of the interposer, wherein the base die includes a pad pattern over a second side of the base die, and wherein the connection pad of the interposer is bonded to the pad pattern of the base die through a solder bump.

20. A semiconductor die stack comprising:

a base die; and core dies stacked over the base die, wherein each of the base die and the core dies include:

a semiconductor substrate having an electric circuit;

a first side passivation layer formed over a first side of the semiconductor substrate;

a second side passivation layer over a second side of the semiconductor substrate;

a through-via vertically penetrating the semiconductor substrate and the first side passivation layer; and a bump, a support pattern, and a bonding insulating layer formed over the first side passivation layer, wherein top surfaces of the bump, the support pattern, and the bonding insulating layer are co-planar, wherein the bump is vertically aligned with the through-via, wherein the support pattern is spaced apart from and not electrically connected to the through-via and the bump, and wherein the support pattern is not electrically connected to the electric circuit in the semiconductor substrate.

* * * * *